(12) United States Patent
Hashimoto et al.

(10) Patent No.: US 7,501,584 B2
(45) Date of Patent: Mar. 10, 2009

(54) CIRCUIT BOARD DEVICE AND METHOD FOR BOARD-TO-BOARD CONNECTION

(75) Inventors: Yoshiyuki Hashimoto, Tokyo (JP); Junya Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/519,002

(22) PCT Filed: Jun. 24, 2003

(86) PCT No.: PCT/JP03/07982

§ 371 (c)(1),
(2), (4) Date: Dec. 27, 2004

(87) PCT Pub. No.: WO04/002203

PCT Pub. Date: Dec. 31, 2003

(65) Prior Publication Data

US 2005/0236179 A1    Oct. 27, 2005

(30) Foreign Application Priority Data

Jun. 25, 2002    (JP) ............................. 2002-184168

(51) Int. Cl.
*H05K 1/02* (2006.01)
(52) U.S. Cl. .......................... 174/259; 29/830; 361/792
(58) Field of Classification Search ......... 174/261–266, 174/259; 361/792–795, 789; 29/830
See application file for complete search history.

(56) References Cited

U.S. PATENT DOCUMENTS

| | | |
|---|---|---|
| 5,165,984 A | 11/1992 | Schoenthaler |
| 5,417,577 A | 5/1995 | Holliday et al. |
| 5,438,223 A | 8/1995 | Higashi et al. |
| 5,627,730 A | 5/1997 | Konig et al. |
| 5,727,310 A * | 3/1998 | Casson et al. .................. 29/830 |
| 5,819,406 A | 10/1998 | Yoshizawa et al. |
| 5,847,327 A | 12/1998 | Fischer et al. |
| 6,108,903 A | 8/2000 | Nakatani et al. |
| 6,323,559 B1 * | 11/2001 | Chan et al. .................. 257/778 |
| 6,670,559 B2 * | 12/2003 | Centola et al. .............. 174/261 |

FOREIGN PATENT DOCUMENTS

| | | |
|---|---|---|
| EP | 0166627 A1 | 3/1985 |
| EP | 0632683 A2 | 1/1995 |
| EP | 0715489 A2 | 6/1996 |
| EP | 0823833 A2 | 2/1998 |
| JP | S54-108957 U | 7/1979 |
| JP | S61-102078 U | 6/1986 |
| JP | S61-218196 A | 9/1986 |

(Continued)

*Primary Examiner*—Jeremy C Norris
(74) *Attorney, Agent, or Firm*—Sughrue Mion, PLLC

(57) ABSTRACT

A structure for connecting substrates to each other, which is capable of thinning an electronic device on which a plurality of circuit boards is mounted, saving a space of the electronic device, and detaching a circuit board from the electronic device. The circuit board unit includes a first substrate including, on a surface thereof, a first group of electrode terminals arranged in a matrix, a second substrate including, on a surface thereof, a second group of electrode terminals arranged in a matrix in alignment with the first group of electrode terminals, and an anisotropic electrical conductor sandwiched between the first and second substrates. The first and second substrates and the anisotropic electrical conductor are pressurized by means of a pressurizer to electrically connect the electrode terminals to each other through the anisotropic electrical conductor.

13 Claims, 11 Drawing Sheets

FOREIGN PATENT DOCUMENTS

| | | |
|---|---|---|
| JP | 61-199074 U | 12/1986 |
| JP | 4-323896 A | 11/1992 |
| JP | H04-324264 A | 11/1992 |
| JP | 5-95191 A | 4/1993 |
| JP | 6-232524 A | 8/1994 |
| JP | H08-023148 A | 1/1996 |
| JP | H08-228074 A | 9/1996 |
| JP | 8-330736 A | 12/1996 |
| JP | 10-93240 A | 4/1998 |
| JP | H10-093240 A | 4/1998 |
| JP | 11-40227 A | 2/1999 |
| JP | 11-111886 A | 4/1999 |
| JP | 2001-024299 A | 1/2001 |
| JP | 2002-57429 A | 2/2002 |

* cited by examiner

CIRCUIT BOARD DEVICE AND METHOD FOR BOARD-TO-BOARD CONNECTION

BACKGROUND OF THE INVENTION

1. Field of the Invention

The invention relates to a circuit board unit including a plurality of substrates, and a method of connecting circuit boards to each other, and more particularly to a structure for connecting flexible printed circuit (FPC) boards includes in various electronic devices, or printed circuit boards such as a rigid printed circuit (RPC) to each other, and a method of connecting them to each other.

2. Description of the Related Art

In an electronic mobile terminal such as a mobile phone or PDA (personal digital assistant), a plurality of printed circuit boards on each of which a lot of electronic components are mounted has been conventionally arranged in a limited space. For electrically connecting such circuit boards to one another, there is usually used a connector or bonding medium such as solder.

For instance, Japanese Patent Application Publications No. 4-324264 and 2001-24299 have suggested a connector for connecting a flexible cable to a printed board.

FIG. 9 is a plan view of an example of a conventional circuit board unit including a plurality of circuit boards electrically connected to one another.

As illustrated in FIG. 9, the circuit board unit includes two RPC substrates 1a and 2a electrically connected to each other through two connectors 10a and 20a. Specifically, the two RPC substrates 1a and 2a are electrically connected to each other with being kept in parallel with each other. For instance, a male connector 10a is arranged on the RPC substrate 1a, and a female connector 20a is arranged on the RPC substrate 2a. The RPC substrates 1a and 2a are connected to each other through the connectors 10a and 20a. The connectors 10a and 20a may be designed to include terminals to be mounted on the RPC substrates 1a and 2a, arranged in a matrix.

FIG. 10 is a perspective view of another example of a conventional circuit board unit.

As illustrated in FIG. 10, a connector 31 is mounted on a RPC substrate 1a, and a FPC substrate 30 is connected to the RPC substrate 1a by being inserted into the connector 31.

In both the circuit board units illustrated in FIGS. 9 and 10, since the substrates can be readily separated from each other, a substrate found defective can be exchanged to a non-defective substrate.

FIG. 11 is a perspective view of still another example of a conventional circuit board unit.

As illustrated in FIG. 11, a FPC substrate 30 including a connector 32 is connected directly to a RPC substrate 1a.

As medium for connecting the substrates to each other, there are usually used solder, an anisotropic conductive film (ACF), or anisotropic conductive paste (ACP).

The above-mentioned solder is identical with solder generally used for mounting an electronic component onto a substrate. A method of connecting substrates to each other through solder includes coating solder paste onto electrode terminals of the substrates, temporarily fixing the substrates to each other, and applying heat and pressure to portions of the substrates at which the substrates make contact with each other, to thereby fix the substrates to each other.

The above-mentioned anisotropic conductive film (ACF) is a film containing a mixture of electrically conductive minute particles and adhesive resin, and the above-mentioned anisotropic conductive paste (ACP) is paste containing the same. Hence, when the substrates are connected to each other, an anisotropic conductive film (ACF) or anisotropic conductive paste (ACP) is sandwiched between the substrates, and then, heat and pressure are applied to ACF or ACP to thereby fixedly connect the substrates to each other, similarly to a process of connecting the substrates to each other through solder.

Furthermore, since solder is used for mounting other components onto a substrate, it would be possible to lower costs.

However, since solder becomes liquidized when used, it is likely to short-circuit adjacent electrodes to each other. Accordingly, solder is not suitable to electrical connection of electrodes arranged in a small pitch. A problem would be caused, if solder were used for electrical connection of electrodes arranged at a pitch of 0.3 mm or smaller.

In contrast, though the above-mentioned anisotropic conductive film (ACF) or anisotropic conductive paste (ACP) costs higher than solder, they make it possible to electrically connect electrodes arranged in a small pitch, to each other. For instance, they may electrically connect electrodes arranged in a pitch of 0.05 mm, to each other. Thus, a glass substrate and a liquid crystal driver in a liquid crystal display device are electrically connected to each other often through an anisotropic conductive film (ACF) or anisotropic conductive paste (ACP).

As mentioned earlier, it is necessary in an electronic device such as a mobile phone or a PDA terminal to mount a plurality of printed circuit boards on each of which a lot of electronic components are mounted, in a limited space. In particular, since a mobile phone and a PDA terminal are often carried in a pocket or a bag, it is quite important to thin and save a space of a connection area at which substrates are connected to each other. In order to thin and save a space of an electronic device, it is beneficial to select connection medium such as solder or an anisotropic conductive film (ACF) among the above-mentioned conventional connection mediums.

Since LSI to which the latest technology is applied is frequently mounted on electronic devices, a rate at which defectiveness is found in components is relatively high. Hence, if solder is used, it would not be possible to reuse substrates connected to each other though solder, if a defectiveness is found in the substrates. This results in an increase in fabrication costs.

If a connection medium which is detachable from a substrate, such as a connector, is selected, it would be possible to remove a substrate on which a defective component is mounted, preventing an increase in fabrication costs, though a height of a device at a location where the connector is mounted is sacrificed.

However, a connector is accompanied with problems with respect to electrical connection, as mentioned below.

First, since a connector accomplishes electrical connection by making contact at a terminal pin thereof with an electrode terminal of a printed circuit board, it would be necessary to prepare a space of a terminal pin of the connector and an area the terminal pin is fixed, resulting in the limitation in narrowing a pitch between adjacent terminal pins. For instance, an upper limitation in a pitch in a FPC connector is 0.3 mm, and the same in a connector for connecting substrates to each other is 0.4 mm.

As a connector for reducing an area necessary for being mounted on a substrate, there may be used a CSP type substrate-to-substrate connector. The connector reduces an area necessary for being mounted on a substrate, by arranging electrodes of a substrate on which the connector is to be mounted, in a matrix.

If electrode terminals were arranged in a matrix, it would be necessary to form a wire extending from the electrode terminals into inner layers of a substrate. Furthermore, if a via-hole is formed at an electrode terminal, the electrode terminal is recessed at a surface thereof by about 15 to 40 micrometers. Thus, if a CSP type connector having high rigidity is mounted on a substrate, there occurs a void, defectiveness in contact, or stress concentration at a via-hole, resulting in reduction in reliability.

SUMMARY OF THE INVENTION

In view of the above-mentioned problems in a conventional circuit board unit, it is an object of the present invention to provide a circuit board unit which can be thinned and can save a space, even if a plurality of circuit boards are connected thereto, and which can connect a plurality of circuit boards to each other such that one of the circuit boards can be separated from the others.

It is also an object of the present invention to provide a method of connecting substrates to each other, which can do the same as the circuit board unit.

Hereinbelow are described a circuit board unit and a method of connecting substrates to each other both in accordance with the present invention through the use of reference numerals used in later described embodiments. The reference numerals are indicated only for the purpose of clearly showing correspondence between claims and the embodiments. It should be noted that the reference numerals are not allowed to use in the interpretation of claims of the present application.

In one aspect of the present invention, there is provided a circuit board unit (100) including a first substrate (1) including, on a surface thereof, a first group of electrode terminals (10, 14) arranged in a matrix, a second substrate (2) including, on a surface thereof, a second group of electrode terminals (20, 22) arranged in a matrix in alignment with the first group of electrode terminals (10, 14), and an anisotropic electrical conductor (3) sandwiched between the first and second substrate (2)s, wherein the first substrate (1), the anisotropic electrical conductor (3), and the second substrate (2) are caused to make close contact with one another in a pressurized condition to electrically connect the first group of electrode terminals (10, 14) and the second group of electrode terminals (20, 22) to each other.

It is preferable that the circuit board unit (100) further includes a pressurizer (40) pressurizing the first substrate (1), the anisotropic electrical conductor (3), and the second substrate (2) such that they make close contact with one another.

For instance, the pressurizer (40) may be designed to include a first plane (4a) which makes contact with the first substrate (1), a second plane (4b) which makes contact with the second substrate (2), and a third plane (4c) which keeps the first and second planes (4a, 4b) in parallel with each other.

It is preferable that the pressurizer (40) is composed of a material having a spring characteristic.

In the circuit board unit (100), each of electrode terminals in the first and second groups of electrode terminals (10, 20) is formed with at least one via-hole (6), at least one wire (7) extends from the first and second groups of electrode terminals (10, 20) through the via-hole (6) and inner layers (5) or a lower surface of the first substrate (1), and a recess caused by the via-hole (6) is absorbed into the anisotropic electrical conductor (3) due to elasticity thereof when the first substrate (1), the anisotropic electrical conductor (3), and the second substrate (2) are pressurized.

In the circuit board unit (100), each of electrode terminals in the first and second groups of electrode terminals (10, 20) is formed with at least one via-hole (12), at least one wire (7) extends from the first and second groups of electrode terminals (10, 20) through the via-hole (12) and inner layers (5) or a lower surface of the first substrate (1), the each of electrode terminals has a planar area (11a, 21a) in which the via-hole (12) is not formed, and the each of electrode terminals makes contact with the anisotropic electrical conductor (3) through the planar area (11a, 21a).

In the circuit board unit (100), each of electrode terminals in the first and second groups of electrode terminals (14, 22) is formed with at least one via-hole (15), at least one wire extends from the first and second groups of electrode terminals (14, 22) through the via-hole (15) and inner layers (5) or a lower surface of the first substrate (1), an exposed surface of the each of electrode terminals defines a planar surface, and the each of electrode terminals makes contact with the anisotropic electrical conductor (3) through the exposed surface.

For instance, the first and second groups of electrode terminals are arranged in a matrix. Herein, the term "matrix" means that electrode terminals are orderly arranged in a grid. It is not always necessary that horizontal and vertical rows of the electrode terminals are orthogonal with each other.

It is preferable that the anisotropic electrical conductor (3) includes either a metal wire selected from a gold wire, a copper wire, a brass wire, a phosphor bronze wire, a nickel wire, or a stainless wire as electrically conductive material, or one of metal particles, gold-plated particles, silver-plated particles and copper-plated particles.

For instance, each of the first and second substrates (1, 2) may be comprised of one of a multi-layered flexible circuit board, a multi-layered rigid printing circuit board, a double-sided flexible circuit board, and a double-sided rigid printing circuit board.

It is preferable that the circuit board unit (100) further includes an adhesive layer formed on surfaces of the anisotropic electrical conductor (3).

In another aspect of the present invention, there is provided a method of connecting a first substrate (1) including, on a surface thereof, a first group of electrode terminals (10, 14), and a second substrate (2) including, on a surface thereof, a second group of electrode terminals (20, 22) arranged in alignment with the first group of electrode terminals (10, 14), to each other, including arranging an anisotropic electrical conductor (3) between the first and second substrate (2)s, and pressurizing the first substrate (1), the second substrate (2), and the anisotropic electrical conductor (3) in a thicknesswise direction thereof to electrically connect the first group of electrode terminals (10, 14) and the second group of electrode terminals (20, 22) to each other.

The advantages obtained by the aforementioned present invention will be described hereinbelow.

As having been explained so far, in accordance with the present invention, since electrode terminals are arranged in a matrix, it is possible to thin the circuit board unit and save a space in the circuit board unit in comparison with a conventional connector. Furthermore, since connection medium such as solder is not used for connecting electrode terminals mounted on substrates, to each other, the substrates are not damaged, and one of the substrates can be readily separated from the other.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

First Embodiment

Figure 1:
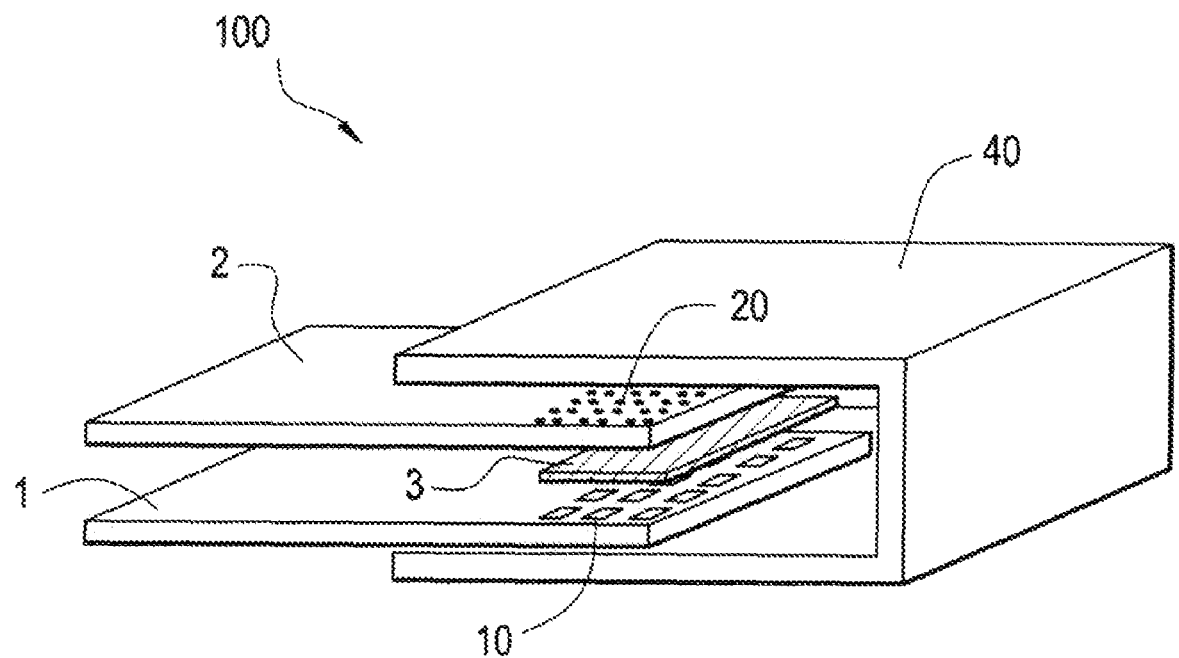
FIG. 1 is a perspective view of a circuit board unit in accordance with the first embodiment of the present invention.
Figure 2:
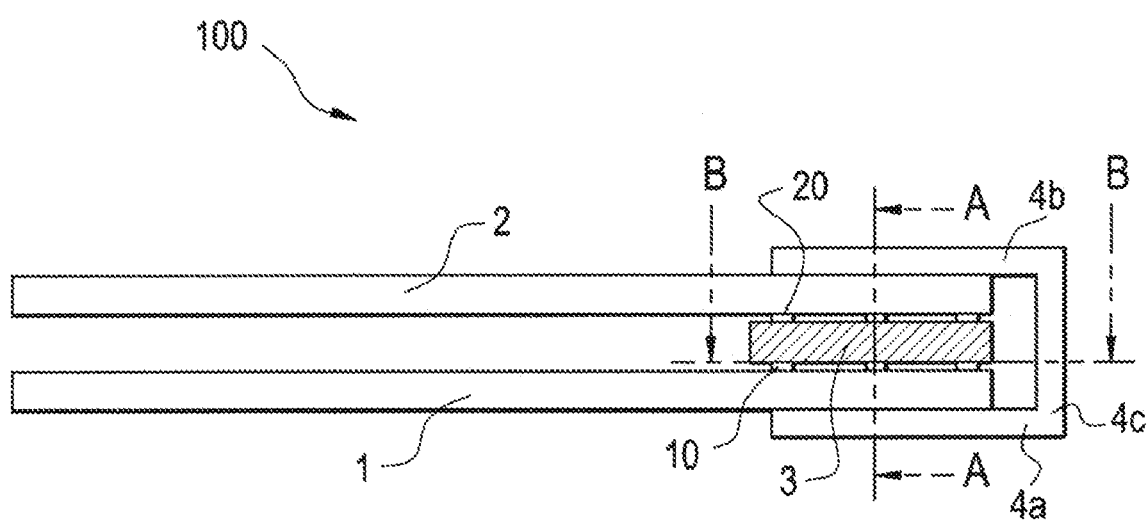
FIG. 2 is a plan view of a circuit board unit in accordance with the first embodiment of the present invention.

FIG. 1 is a perspective view of a circuit board unit 100 in accordance with the first embodiment of the present invention, and FIG. 2 is a plan view of the circuit board unit 100.

As illustrated in FIGS. 1 and 2, the circuit board unit 100 in accordance with the first embodiment is comprised of a first substrate 1 including first electrode terminals 10 on a surface thereof, a second substrate 2 including second electrode terminals on a surface thereof, an anisotropic electrical conductor 3 sandwiched between the first and second electrode terminals 10 and 20 of the first and second substrates 1 and 2, and a pressurizer 40 applying a pressure to the first and second electrode terminals 10 and 20 for connection of them.

Each of the first and second electrode terminals 10 and 20 is comprised of a plurality of metal terminals (a group of terminals) arranged in a matrix, and those metal terminals are in alignment with each other.

The pressurizer 40 is comprised of a first plane 4a which makes contact with a lower surface of the first substrate 1, a second plane 4b which makes contact with an upper surface of the second substrate 2, and a third plane 4c which keeps the first and second planes 4a and 4b in parallel with each other.

As mentioned later, the pressurizer 40 is composed of a material having a spring characteristic.

As illustrated in FIG. 2, the first substrate 1, the second substrate 2 and the anisotropic electrical conductor 3 are inserted into the pressurizer 40 with the anisotropic electrical conductor 3 being sandwiched between the first and second substrates 1 and 2.

The first substrate 1, the second substrate 2 and the anisotropic electrical conductor 3 sandwiched between the first and second substrates 1 and 2 are pressed by the pressurizer 40 to cause the anisotropic electrical conductor 3 to make contact with the first electrode terminals 10 and the second electrode terminals 20. As a result, the first electrode terminals 10 of the first substrate 1 and the second electrode terminals 20 of the second substrate 2 are electrically connected to each other through the anisotropic electrical conductor 3.

The anisotropic electrical conductor 3 contains electrically conductive material in order to ensure its electrical conductivity. For instance, a metal wire or metal particles may be selected as such electrically conductive material. As a metal wire, there may be used a wire composed of gold, copper brass, phosphor bronze, nickel, stainless or other metals.

Furthermore, it is possible to lower a resistance of a metal wire by partially or wholly plate the metal wire with gold.

In place of metal particles, there may be used carbon particles or resin particles plated with gold.

For instance, an optimal diameter of the metal wire is in the range of 5 to 40 micrometers. This is because if the metal wire is thick, specifically, if the diameter is over 40 micrometers, the anisotropic electrical conductor 3 would have too high rigidity, and hence, a higher pressure would be required, and in contrast, if the metal wire is thin, specifically, the diameter is smaller than 5 micrometers, the metal wire would have a high resistance, resulting in that the metal wire is not suitable for electrically connecting the first and second electrode terminals 10 and 20 to each other.

A pressure for pressurizing the first substrate 10, the second substrate 20, and the anisotropic electrical conductor 3 by means of the pressurizer 40 is preferably in the range of 0.05 to 1.2 N per an electrode terminal.

The pressure is dependent on rigidity, thickness and composition of the anisotropic electrical conductor 3, and further on flatness of the electrode terminals 10 and 20.

There may be formed an adhesive layer on surfaces of the anisotropic electrical conductor 3 making contact with the electrode terminals 10 and 20, ensuring that the first and second substrates and the anisotropic electrical conductor can be readily assembled, and that it is possible to prevent deviation of the anisotropic electrical conductor caused by vibration. The adhesive layer may be formed by coating adhesive material, for instance.

As the first and second substrates 10 and 20, there may be used any one of a FPC substrate and a RPC substrate.

Hereinbelow are explained examples of a structure of the circuit board unit 100 in accordance with the first embodiment, and a method of connecting substrates to each other.

EXAMPLE 1

Figure 3:
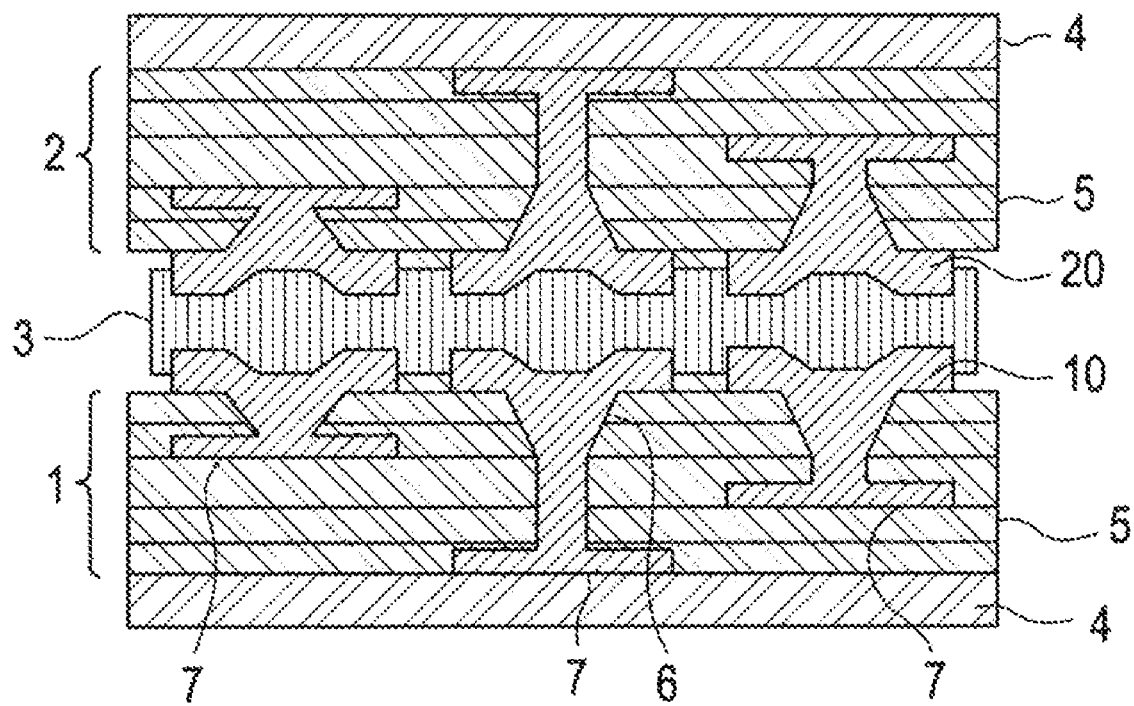
FIG. 3 is a cross-sectional view taken along the line A-A in FIG. 2.
Figure 4:
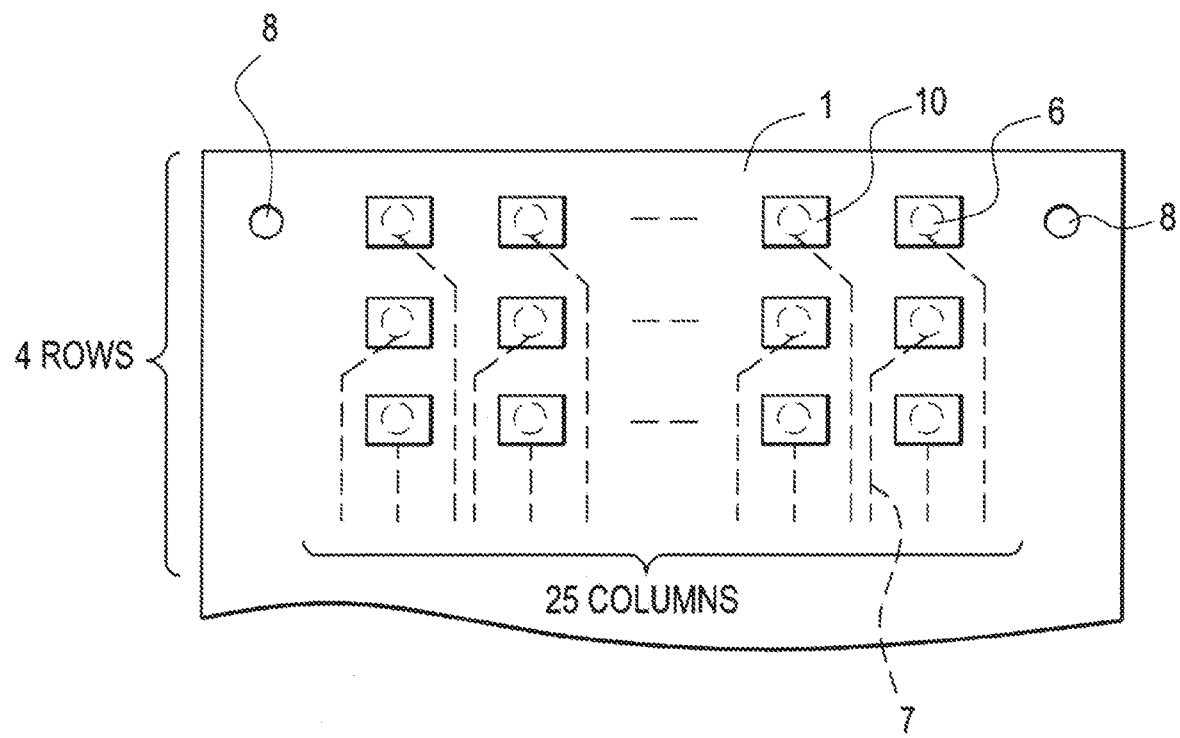
FIG. 4 is a cross-sectional view taken along the line B-B in FIG. 2.

FIG. 3 is a cross-sectional view taken along the line A-A in FIG. 2, and FIG. 4 is a cross-sectional view taken along the line B-B in FIG. 2.

As illustrated in FIG. 3, each of the first and second substrates 2 is comprised of a RPC substrate including a substrate 4 composed of FR4, and six layers 5 formed on the substrate 4 (FIG. 3 illustrates six wiring layers formed on five plates).

As illustrated in FIG. 4, each of the first and second electrode terminals 10 and 20 is comprised of 100 terminals arranged in alignment with each other. Those 100 terminals have a dimension of 0.3×0.3×0.04 mm, and are arranged in a 4×25 matrix at a pitch P of 0.4 mm.

Each of the first electrode terminals 10 and each of the second electrode terminals 20 are formed with a via-hole 6. A wiring pattern 7 extends in the via-hole 6 through the second to sixth inner layers of the first and second substrates 1 and 2.

Forming the first electrode terminals 10 and the second electrode terminals 20 facing the first electrode terminals 10 with the via-hole 6, a recess having a depth of about 45 micrometers is formed at surfaces of the electrode terminals 10 and 20. The recess is absorbed into the anisotropic electrical conductor 3 arranged between the first electrode terminals 10 and the second electrode terminals 10 due to the elasticity of the anisotropic electrical conductor 3. Hence, the anisotropic electrical conductor 3 makes close contact with the surfaces of the first and second electrode terminals 10 and 20, and thus, the first and second electrode terminals 10 and 20 are electrically connected to each other through the anisotropic electrical conductor 3.

As the anisotropic electrical conductor 3, there is used Si rubber including a core having a rubber hardness of 20, and as the electrically conductive material, there is used a SUS wire having a diameter of 12 micrometers and plated with Au. The anisotropic electrical conductor 3 has a thickness of 0.3 mm, and the pressurizer 40 pressurizes the first substrate 1, the second substrate 2, and the anisotropic electrical conductor 3 at 0.6 N per a terminal.

The pressurizer 40 is in the form of a flat-plate spring, and has a thickness of 0.3 mm. The pressurizer 40 is composed of SUS304CPS.

Observing alignment marks 8 formed on the first substrate 1, the second substrate 2, and the anisotropic electrical conductor 3 with a CCD camera, the anisotropic electrical conductor 3 is positioned relative to the first substrate 1, and the second substrate 2 is positioned relative to the first substrate 1. A positioning accuracy is within ±50 micrometers, and all of the 100 electrode terminals are tested as to whether a current runs therethrough.

Each of the first and second electrode terminals 10 and 20 is arranged in a 4×25 matrix. However, the number of the first and second electrode terminals 10 and 20 is not to be limited to 100, and the first and second electrode terminals 10 and 20 may be arranged in a N×M matrix (N and M are positive integers equal to or greater than 2).

In Example 1, since the first and second electrode terminals 10 and 20 are arranged in a matrix, it is possible to save a space in comparison with a conventional connector.

Furthermore, since connection medium such as solder is not used for electrically connecting the first and second electrode terminals 10 and 20 to each other, the substrates 1 and 2 are not damaged. In addition, since one of the substrates can be readily separated from the other, it would be possible to connect detachable substrates to each other, similarly to a case where substrates are connected to each other through a connector.

EXAMPLE 2

Figure 5:
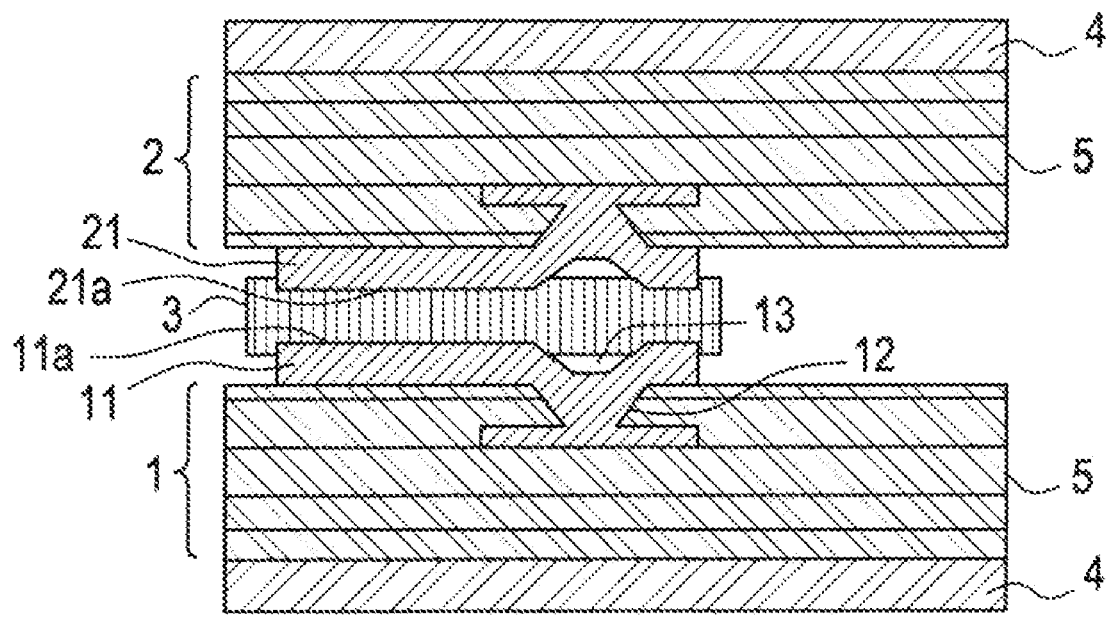
FIG. 5 is a cross-sectional view taken along a line corresponding to the line A-A in FIG. 2 in the second example of the circuit board unit in accordance with the first embodiment of the present invention.
Figure 6:
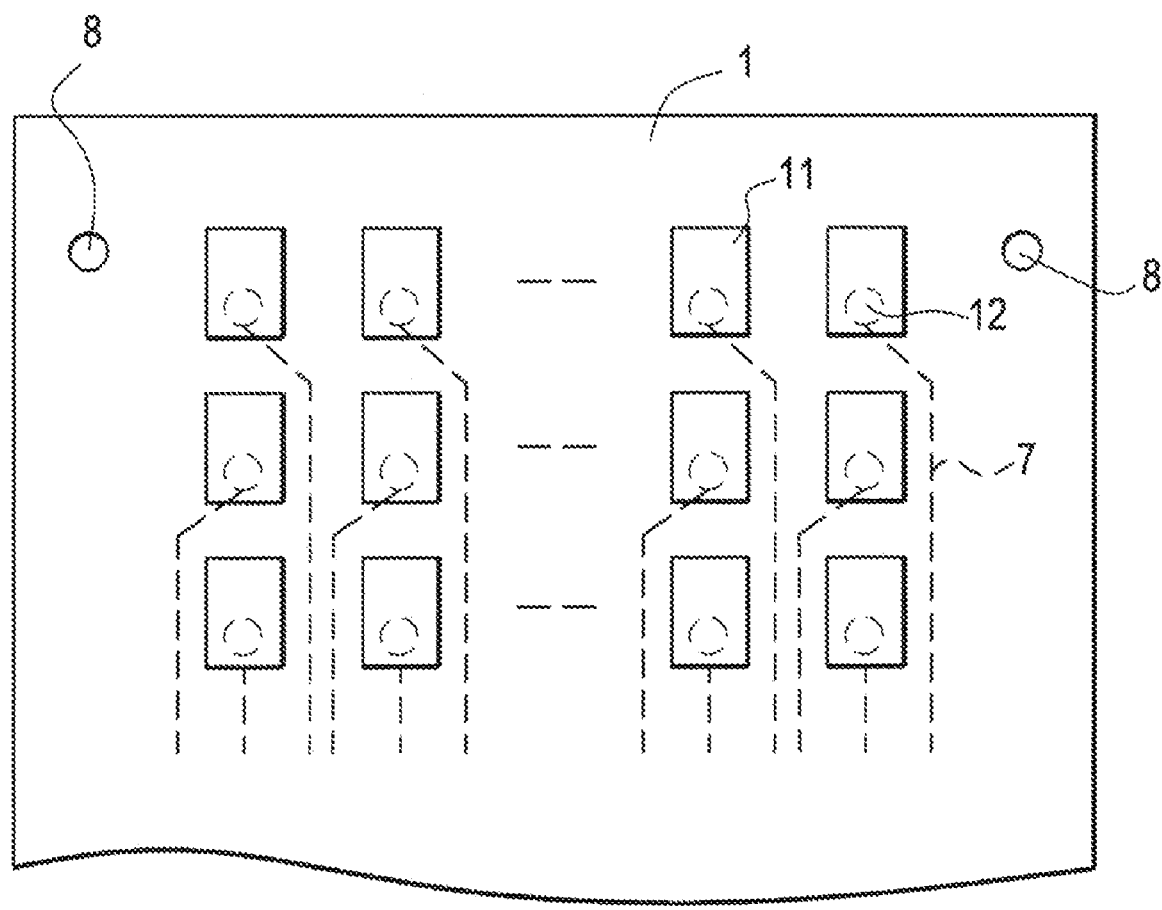
FIG. 6 is a cross-sectional view taken along a line corresponding to the line B-B in FIG. 2 in the second example of the circuit board unit in accordance with the first embodiment of the present invention.

FIG. 5 is a cross-sectional view taken along a line corresponding to the line A-A in FIG. 2 in Example 2, and FIG. 6 is a cross-sectional view taken along a line corresponding to the line B-B in FIG. 2 in Example 2.

Similarly to Example 1, each of the first and second substrates 2 in Example 2 is comprised of a RPC substrate including a substrate 4 composed of FR4, and six layers 5 formed on the substrate 4.

As illustrated in FIG. 6, each of first and second electrode terminals 11 and 21 is comprised of 100 terminals arranged in alignment with each other. Those 100 terminals have a dimension of 0.3×0.5×0.04 mm, and are arranged in a 4×25 matrix at a X-direction pitch Px of 0.4 mm and a Y-direction pitch Py of 0.6 mm.

The first electrode terminals 11 arranged in a matrix at a surface of the first substrate 1 and the second electrode terminals 21 arranged in a matrix at a surface of the second substrate 2 are formed with a via-hole 12. A wiring pattern 7 extends in the via-hole 12 through the second to sixth inner layers of the first and second substrates 1 and 2.

Forming the first electrode terminals 11 and the second electrode terminals 21 facing the first electrode terminals 11 with the via-hole 12, a recess 13 having a depth of about 45 micrometers is formed at surfaces of the electrode terminals 11 and 21.

Hence, the electrode terminals 11 and 21 in Example 2 are formed with planar areas 11a and 21a, respectively, in adjacent relation to the recess 13. For instance, by designing an area of the surfaces of the electrode terminals 11 and 21 to be 1.5 to 3 times larger than an area of the via-hole 12, it is possible to enlarge a planar portion of the electrode terminals 11 and 21 to thereby form the planar areas 11a and 21a.

For instance, if the via-hole 12 has a diameter of 0.1 mm, the electrode terminals 11 and 21 are designed to have a length (a length in a left-to-right direction in FIG. 5) of 0.3 mm.

By forming the planar areas 11a and 21a, it is no longer necessary to deform the anisotropic electrical conductor 3 to make close contact with the recess 13 formed at surfaces of the electrode terminals 11 and 21, that is, to absorb the recess 13 into the anisotropic electrical conductor 3 due to the elasticity of the anisotropic electrical conductor 3. Since the electrode terminals 11 and 21 make contact at the planar areas 11 and 21a with the anisotropic electrical conductor 3, the electrode terminals 11 and 21 are electrically connected to each other with small load.

As the anisotropic electrical conductor 3, there is used Si rubber including a core having a rubber hardness of 20, and as the electrically conductive material, there is used a SUS wire having a diameter of 12 micrometers and plated with Au. The anisotropic electrical conductor 3 has a thickness of 0.3 mm, and the pressurizer 40 pressurizes the first substrate 1, the second substrate 2, and the anisotropic electrical conductor 3 at 0.1 N per a terminal.

The pressurizer 40 is in the form of a flat-plate spring, and has a thickness of 0.3 mm. The pressurizer 40 is composed of SUS304CPS.

Observing alignment marks 8 formed on the first substrate 1, the second substrate 2, and the anisotropic electrical conductor 3 with a CCD camera, the anisotropic electrical conductor 3 is positioned relative to the first substrate 1, and the second substrate 2 is positioned relative to the first substrate 1. A positioning accuracy is within ±50 micrometers, and all of the 100 electrode terminals are tested as to whether a current runs therethrough.

Each of the first and second electrode terminals 11 and 21 is arranged in a 4×25 matrix. However, the number of the first and second electrode terminals 11 and 21 is not to be limited to 100, and the first and second electrode terminals 11 and 21 may be arranged in a N×M matrix (N and M are positive integers equal to or greater than 2).

In Example 2, since the first and second electrode terminals 11 and 21 are arranged in a matrix, it is possible to save a space in comparison with a conventional connector.

Furthermore, since connection medium such as solder is not used for electrically connecting the first and second electrode terminals 11 and 21 to each other, the substrates 1 and 2 are not damaged. In addition, since one of the substrates can be readily separated from the other, it would be possible to connect detachable substrates to each other, similarly to a case where substrates are connected to each other through a connector.

Furthermore, in comparison with Example 1, it is possible in Example 2 to reduce a pressure to be applied to the first substrate 1, the second substrate 2 and the anisotropic electrical conductor 3 through the pressurizer 40. Specifically, whereas a force of 0.6 N was applied to them in Example 1, a force of 0.1 N is applied to them in Example 2.

EXAMPLE 3

Figure 7:
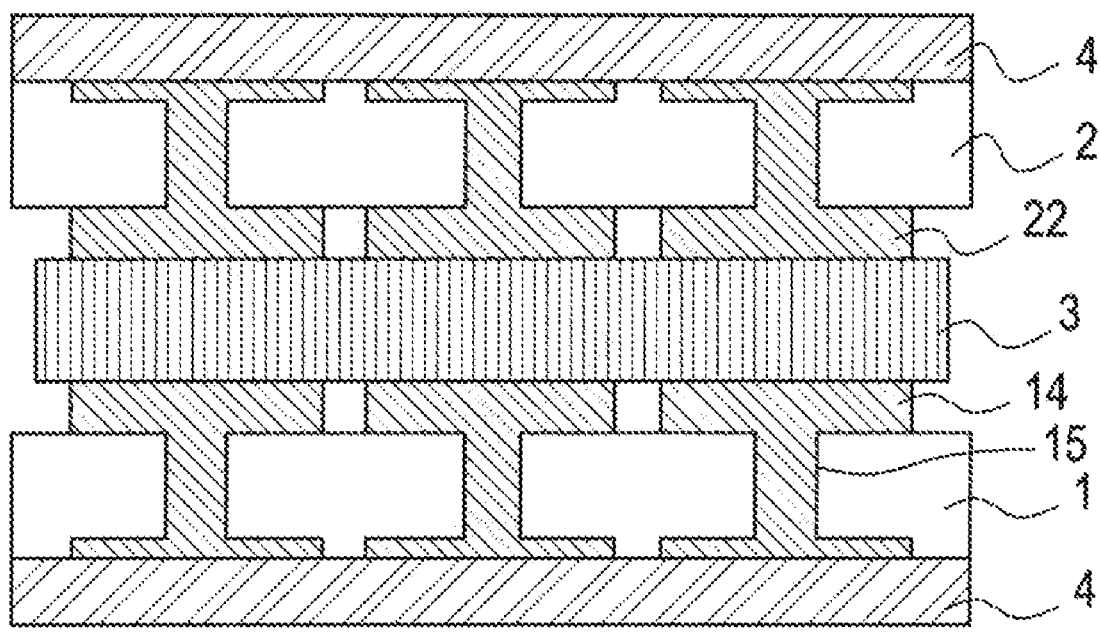
FIG. 7 is a cross-sectional view taken along a line corresponding to the line A-A in FIG. 2 in the third example of the circuit board unit in accordance with the first embodiment of the present invention.
Figure 8:
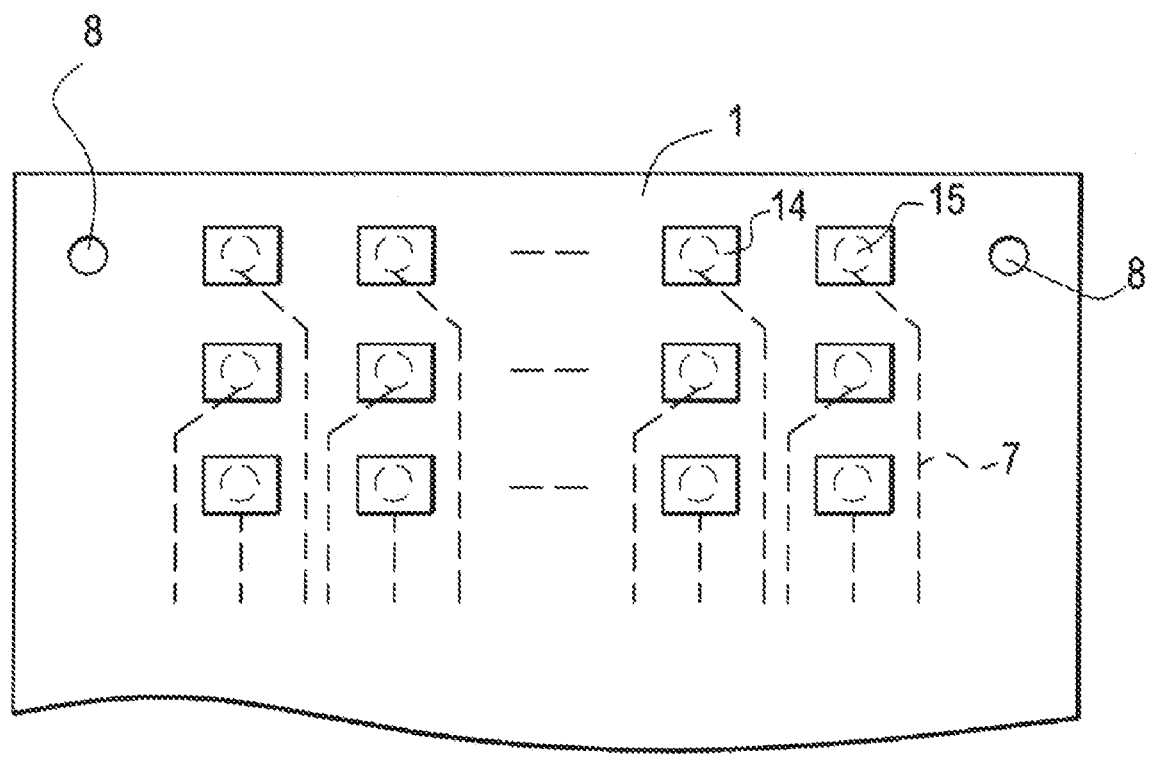
FIG. 8 is a cross-sectional view taken along a line corresponding to the line B-B in FIG. 2 in the third example of the circuit board unit in accordance with the first embodiment of the present invention.
Figure 9:
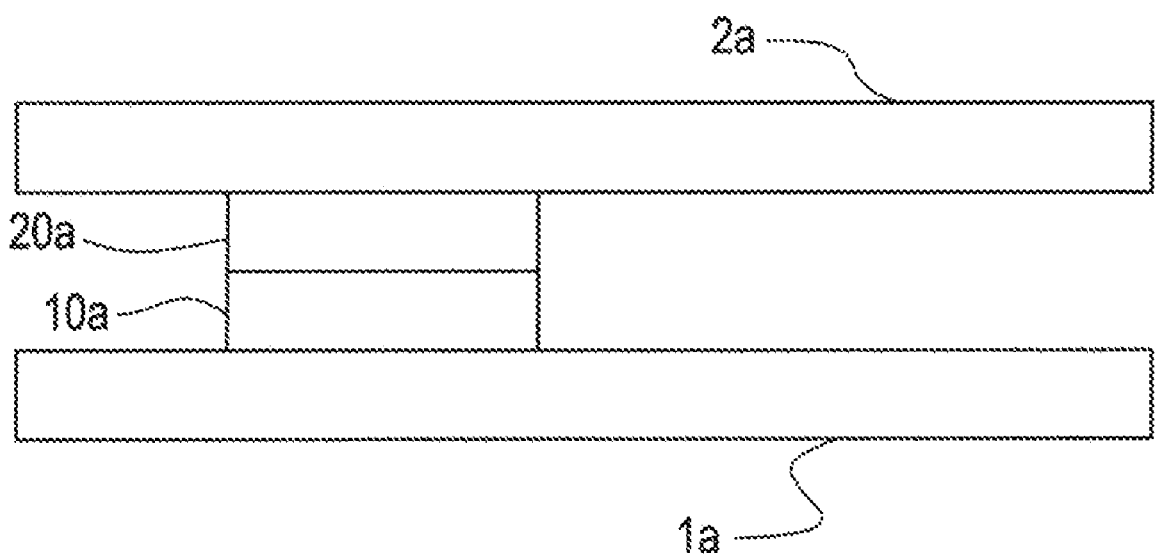
FIG. 9 is a plan view of an example of a conventional circuit board unit.
Figure 10:
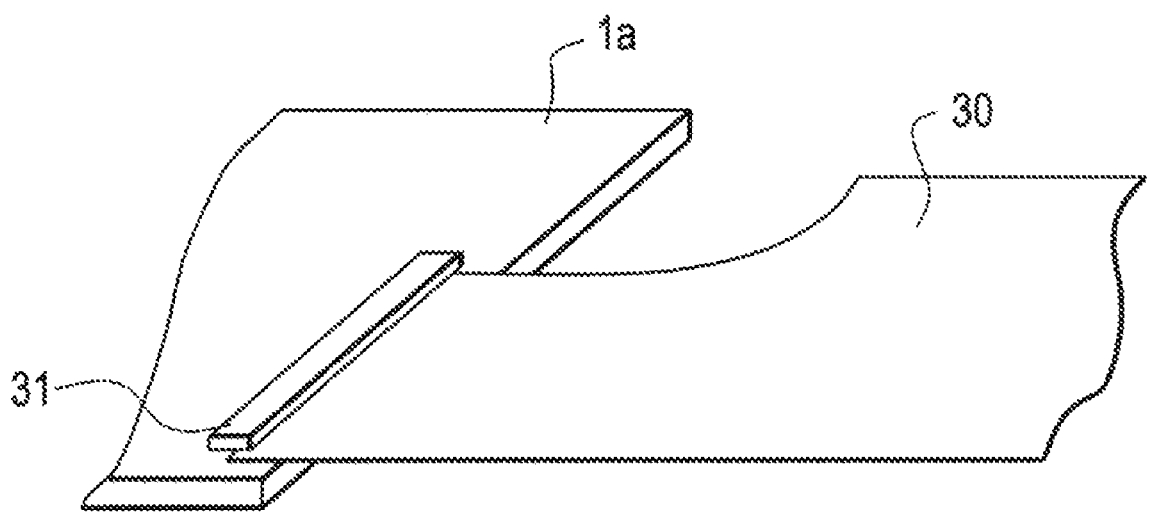
FIG. 10 is a perspective view of another example of a conventional circuit board unit.
Figure 11:
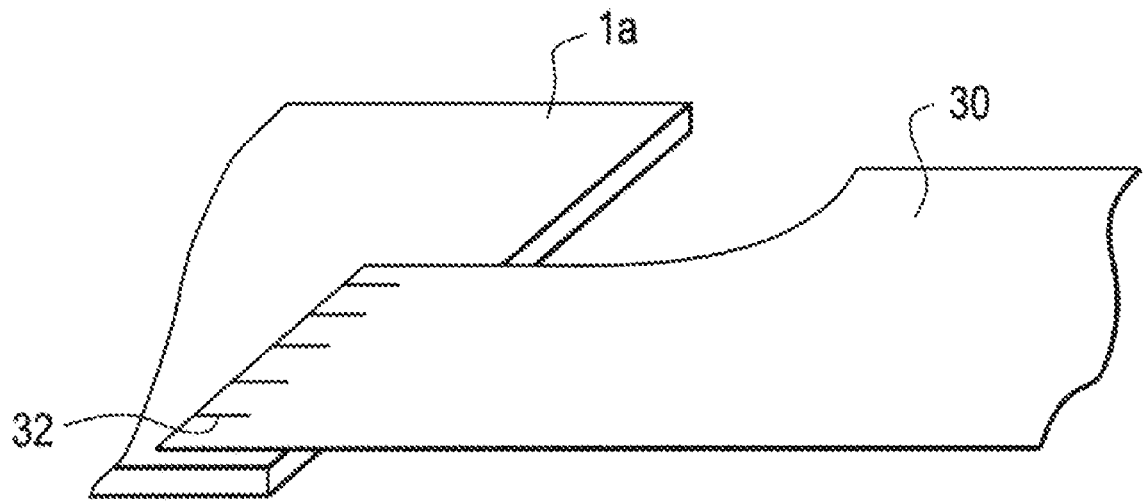
FIG. 11 is a perspective view of still another example of a conventional circuit board unit.

FIG. 7 is a cross-sectional view taken along a line corresponding to the line A-A in FIG. 2 in Example 3, and FIG. 8 is a cross-sectional view taken along a line corresponding to the line B-B in FIG. 2 in Example 3.

As illustrated in FIG. 7, as the first and second substrates 1 and 2 in Example 3, there is used a double-sided FPC comprise of a polyimide substrate, and a copper wiring layer formed on surfaces of the polyimide substrate.

As illustrated in FIG. 8, each of first and second electrode terminals 14 and 22 is comprised of 100 terminals arranged in alignment with each other. Those 100 terminals have a dimension of 0.2×0.2×0.04 mm, and are arranged in a 4×25 matrix at a pitch P of 0.4 mm.

Via-holes 15 through which wirings 7 extend to a lower surface of the substrate from the electrode terminals 14 and 22 are filled with Cu paste. By applying Cu electrolytic plating to the via-hole by a thickness of 15 micrometers after the via-hole 15 has been filled with Cu paste, a recess caused at surfaces of the electrode terminals 14 and 22 by the formation of the via-hole 15 is filled with Cu. As a result, the electrode terminals 14 and 22 have a height of about 19 micrometers, and further have a flat surface having flatness of about 5 micrometers.

As the anisotropic electrical conductor 3 arranged between the electrode terminals 14 and 22, there is used Si rubber including a core having a rubber hardness of 40, and as the electrically conductive material, there is used a SUS wire having a diameter of 12 micrometers and plated with Au. The anisotropic electrical conductor 3 has a thickness of 0.3 mm, and the pressurizer 40 pressurizes the first substrate 1, the second substrate 2, and the anisotropic electrical conductor 3 at 0.12 N per a terminal.

The pressurizer 40 is in the form of a flat-plate spring, and has a thickness of 0.3 mm. The pressurizer 40 is composed of SUS304CPS.

Observing alignment marks 8 formed on the first substrate 1, the second substrate 2, and the anisotropic electrical conductor 3 with a CCD camera, the anisotropic electrical conductor 3 is positioned relative to the first substrate 1, and the second substrate 2 is positioned relative to the first substrate 1. A positioning accuracy is within ±50 micrometers, and all of the 100 electrode terminals are tested as to whether a current runs therethrough.

Each of the first and second electrode terminals 14 and 22 is arranged in a 4×25 matrix. However, the number of the first and second electrode terminals 14 and 22 is not to be limited to 100, and the first and second electrode terminals 14 and 22 may be arranged in a N×M matrix (N and M are positive integers equal to or greater than 2).

In Example 3, similarly to Examples 1 and 2, since the first and second electrode terminals 14 and 22 are arranged in a matrix, it is possible to save a space in comparison with a conventional connector.

Furthermore, since connection medium such as solder is not used for electrically connecting the first and second electrode terminals 14 and 22 to each other, the substrates 1 and 2 are not damaged. In addition, since one of the substrates can be readily separated from the other, it would be possible to connect detachable substrates to each other, similarly to a case where substrates are connected to each other through a connector.

Furthermore, since the recess formed on surfaces of the electrode terminals 14 and 22 due to the formation of the via-hole 15 is filled with Cu, it is possible in Example 3 to reduce a pressure to be applied to the first substrate 1, the second substrate 2 and the anisotropic electrical conductor 3 through the pressurizer 40, in comparison with Example 1. Specifically, whereas a force of 0.6 N was applied to them in Example 1, a force of 0.12 N is applied to them in Example 3.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-184168 filed on Jun. 25, 2002 including specification, claims, drawings and summary is incorporated herein by reference in its entirety.

The invention claimed is:

1. A circuit board unit comprising:
    a first substrate including, on a surface thereof, a first group of electrode terminals arranged in a matrix;
    a second substrate including, on a surface thereof, a second group of electrode terminals arranged in a matrix in alignment with said first group of electrode terminals;
    an anisotropic electrical conductor sandwiched between said first and second substrates, wherein said anisotropic electrical conductor includes either a metal wire selected from a gold wire, a copper wire, a brass wire, a phosphor bronze wire, a nickel wire, or a stainless wire as electrically conductive material, or one of gold-plated particles, silver-plated particles, and copper-plated particles; and
    a pressurizer pressurizing said first substrate, said anisotropic electrical conductor, and said second substrate wherein said first substrate, said anisotropic electrical conductor, and said second substrate are caused to electrically connect to each other,
    wherein said pressurizer is composed of a material having a spring characteristic.

2. The circuit board unit as set forth in claim 1, wherein said pressurizer includes a first plane which makes contact with said first substrate, a second plane which makes contact with said second substrate, and a third plane which keeps said first and second planes in parallel with each other.

3. The circuit board unit as set forth in claim 1, wherein each of electrode terminals in said first and second groups of electrode terminals is formed with at least one via-hole,
    at least one wire extends from said first and second groups of electrode terminals through said via-hole and inner layers or a lower surface of said first substrate, and a recess caused by said via-hole is absorbed into said anisotropic electrical conductor due to elasticity thereof when said first substrate, said anisotropic electrical conductor, and said second substrate are pressurized.

4. The circuit board unit as set forth in claim 1, wherein each of electrode terminals in said first and second groups of electrode terminals is formed with at least one via-hole,
at least one wire extends from said first and second groups of electrode terminals through said via-hole and inner layers or a lower surface of said first substrate,
said each of electrode terminals has a planar area in which said via-hole is not formed, and
said each of electrode terminals makes contact with said anisotropic electrical conductor through said planar area.

5. The circuit board unit as set forth in claim 1, wherein each of electrode terminals in said first and second groups of electrode terminals is formed with at least one via-hole,
at least one wire extends from said first and second groups of electrode terminals through said via-hole and inner layers or a lower surface of said first substrate,
an exposed surface of said each of electrode terminals defines a planar surface, and
said each of electrode terminals makes contact with said anisotropic electrical conductor through said exposed surface.

6. The circuit board unit as set forth in claim 1, wherein each of said first and second substrates is comprised of one of a multi-layered flexible circuit board, a multi-layered rigid printing circuit board, a double-sided flexible circuit board, and a double-sided rigid printing circuit board.

7. The circuit board as set forth in claim 1, further comprising an adhesive layer formed on surfaces of said anisotropic electrical conductor.

8. A method of connecting a first substrate and a second substrate to each other, the method comprising:
arranging an anisotropic electrical conductor between said first and second substrates, wherein said anisotropic electrical conductor includes either a metal wire selected from a gold wire, a copper wire, a brass wire, a phosphor bronze wire, a nickel wire, or a stainless wire as electrically conductive material, or one of gold-plated particles, silver-plated particles, and copper-plated particles,
wherein said first substrate includes, on a surface thereof, a first group of electrode terminals arranged in a matrix, and said second substrate includes, on a surface thereof, a second group of electrode terminals arranged in a matrix in alignment with said first group of electrode terminals; and
attaching a pressurizer to said first substrate, said second substrate, and said anisotropic electrical conductor to pressurize said first substrate, said second substrate, and said anisotropic electrical conductor in a thickness-wise direction thereof to electrically connect to each other,
wherein said pressurizer is composed of a material having a spring characteristic.

9. A circuit board unit comprising:
a first substrate including, on a surface thereof, a first group of electrode terminal arranged in a matrix;
a second substrate including, on a surface thereof, a second group of electrode terminals arranged in a matrix in alignment with said first group electrode terminals;
an anisotropic electrical conductor sandwiched between said first and second substrates, wherein said anisotropic electrical conductor includes either a metal wire selected from a gold wire, a copper wire, a brass wire, a phosphor bronze wire, a nickel wire, or a stainless wire as electrically conductive material, or one of gold-plated particles, silver-plated particles, and copper-plated particles; and
a pressurizer pressurizing said first substrate, said anisotropic electrical conductor, and said second substrate such that they make close contact with one another,
said pressurizer including a first plane which makes contact with said first substrate, a second plane which makes contact with said second substrate, and a third plane which keeps said first and second planes in parallel with each other,
said pressurizer being composed of a material having a spring characteristic,
wherein said first substrate, said anisotropic electrical conductor, and said second substrate are caused to make close contact with one another in a pressurized condition to electrically connect said first group of electrode terminals and said second group of electrode terminals to each other.

10. The circuit board unit as set forth in claim 9, wherein each of electrode terminals in said first and second groups of electrode terminals is formed with at least one via-hole,
at least one wire extends from said first and second groups of electrode terminals through said via-hole and inner layers or a lower surface of said first substrate,
an exposed surface of said each of electrode terminals defines a planar surface, and
said each of electrode terminals makes contact with said anisotropic electrical conductor through said exposed surface.

11. The circuit board unit as set forth in claim 9, wherein each of said first and second substrates is comprised of one of a multi-layered flexible circuit board, a multi-layered rigid printing circuit board, a double-sided flexible circuit board, and a double-sided rigid printing circuit board.

12. The circuit board unit as set forth in claim 9, further comprising an adhesive layer formed on surfaces of said anisotropic electrical conductor.

13. A method of connecting a first substrate including, on a surface thereof, a first group of electrode terminals, and a second substrate including, on a surface thereof, a second group of electrode terminals arranged in alignment with said first group of electrode terminals, to each other, comprising:
arranging an anisotropic electrical conductor between said first and second substrates, wherein said anisotropic electrical conductor includes either a metal wire selected from a gold wire, a copper wire, a brass wire, a phosphor bronze wire, a nickel wire, or a stainless wire as electrically conductive material, or one of gold-plated particles, silver-plated particles, and copper-plated particles; and
pressurizing said first substrate, said second substrate, and said anisotropic electrical conductor in a thickness-wise direction thereof through the use of a pressurizer to electrically connect said first group of electrode terminals and said second group of electrode terminals to each other,
said pressurizer pressurizing said first substrate, said anisotropic electrical conductor, and said second substrate such that they make close contact with one another,
said pressurizer including a first plane which makes contact with said first substrate, a second plane which makes contact with said second substrate, and a third plane which keeps said first and second planes in parallel with each other,
said pressurizer being composed of a material having a spring characteristic.

* * * * *